United States Patent
Shyu et al.

(10) Patent No.: US 6,878,986 B2
(45) Date of Patent: Apr. 12, 2005

(54) EMBEDDED FLASH MEMORY CELL HAVING IMPROVED PROGRAMMING AND ERASING EFFICIENCY

(75) Inventors: Der-Shin Shyu, Hsinchu (TW); Hung-Cheng Sung, Hsin-chu (TW); Chen-Ming Huang, Jungli (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 129 days.

(21) Appl. No.: 10/403,137

(22) Filed: Mar. 31, 2003

(65) Prior Publication Data

US 2004/0188750 A1 Sep. 30, 2004

(51) Int. Cl.[7] .......................................... H01L 29/788
(52) U.S. Cl. ................. 257/315; 257/E21.682; 257/E27.103; 438/265; 438/279; 438/283; 438/303
(58) Field of Search .................. 257/E21.682, E27.103; 438/265, 279, 283, 303

(56) References Cited

U.S. PATENT DOCUMENTS

| | | | |
|---|---|---|---|
| 5,631,482 A | 5/1997 | Hong | 257/326 |
| 5,702,965 A | 12/1997 | Kim | 47/43 |
| 5,734,607 A | 3/1998 | Sung et al. | 365/185.01 |
| 5,736,444 A | 4/1998 | Kauffman et al. | 438/257 |
| 6,054,350 A | 4/2000 | Hsieh et al. | 438/261 |
| 6,074,914 A | 6/2000 | Ogura | 438/257 |
| 6,091,101 A | 7/2000 | Wang | 257/315 |
| 6,207,507 B1 | 3/2001 | Wang | 438/267 |
| 6,303,454 B1 | 10/2001 | Yeh et al. | 438/305 |
| 6,326,661 B1 | 12/2001 | Dormans et al. | 257/315 |
| 6,331,464 B1 | 12/2001 | Liou et al. | 438/257 |
| 6,355,524 B1 | 3/2002 | Tuan et al. | 438/257 |
| 6,355,527 B1 * | 3/2002 | Lin et al. | 438/265 |
| 6,380,583 B1 | 4/2002 | Hsieh et al. | 257/314 |
| 6,384,450 B1 | 5/2002 | Hidaka et al. | 257/321 |
| 6,414,350 B1 | 7/2002 | Hsieh et al. | 257/315 |
| 6,432,773 B1 | 8/2002 | Gerber et al. | 438/261 |
| 6,479,346 B1 | 11/2002 | Yi et al. | 438/257 |
| 6,479,859 B2 | 11/2002 | Hsieh et al. | 257/315 |
| 6,482,699 B1 | 11/2002 | Hu et al. | 438/258 |
| 2002/0009852 A1 | 1/2002 | Kobayashi et al. | 438/261 |
| 2002/0031886 A1 | 3/2002 | Lim | 438/257 |
| 2002/0036316 A1 | 3/2002 | Fujio et al. | 257/314 |
| 2002/0109181 A1 | 8/2002 | Hsieh et al. | 257/314 |
| 2002/0110984 A1 | 8/2002 | Liou et al. | 438/259 |
| 2002/0142535 A1 | 10/2002 | Ho et al. | 438/201 |
| 2002/0142545 A1 | 10/2002 | Lin | 438/257 |
| 2002/0149050 A1 | 10/2002 | Fazio et al. | 257/314 |
| 2003/0011017 A1 | 1/2003 | Lee et al. | 257/314 |
| 2003/0013255 A1 | 1/2003 | Lojek et al. | 438/266 |

* cited by examiner

*Primary Examiner*—David Nelms
*Assistant Examiner*—Mai-Huong Tran
(74) *Attorney, Agent, or Firm*—Duane Morris LLP

(57) ABSTRACT

A memory cell including a substrate having a source region; a floating gate structure disposed over the substrate and associated with the source region; and a source coupling enhancement structure covering an exposed portion of the floating gate structure and extending to the source region. The flash memory cell can be fabricated in a method including the steps of forming the floating gate structure over a substrate; forming the source coupling enhancement structure on an exposed portion of the floating gate structure; and forming the source region in the substrate.

30 Claims, 7 Drawing Sheets

EMBEDDED FLASH MEMORY CELL HAVING IMPROVED PROGRAMMING AND ERASING EFFICIENCY

FIELD OF THE INVENTION

The present invention relates to semiconductors and more specifically, to an embedded flash memory cell having an increased source coupling ratio that improves the programming and erasing efficiency of the cell and a method of fabricating such a memory cell.

BACKGROUND OF THE INVENTION

A flash memory is a type of non-volatile memory device that may be programmed by hot electron injection and erased by Fowler-Nordheim tunneling. Typical flash memories include a plurality of memory cells formed on a semiconductor substrate. Each cell includes a drain region and a source region embedded in the substrate. A channel region is disposed between the drain region and the source region. The memory cell may further include a multi-layer split gate structure or word line. The split gate structure may include: a thin gate dielectric or tunnel oxide film formed on the surface of the substrate overlaying the channel region; a floating gate formed of an electroconductive film, such as polysilicon, overlaying the tunnel oxide; an intergate dielectric film overlaying the floating gate; and a control gate formed of an electroconductive film, such as polysilicon, overlaying the intergate dielectric film.

The source coupling ratio of a flash memory cell is generally used as an gauge to evaluate the programming and erasing efficiency of the cell. Increasing the source coupling ratio of the memory cell will generally result in an increase in the programming and erasing efficiency of the cell. Accordingly, to increase programming and erasing efficiency, a need exists for an embedded flash memory cell having a higher source coupling ratio, and a method of fabricating such a memory cell.

SUMMARY OF THE INVENTION

A first aspect of the invention is a flash memory cell. The memory cell comprises: a substrate having a source region; a floating gate structure disposed over the substrate and associated with the source region; and a source coupling enhancement structure covering an exposed portion of the floating gate structure and extending to the source region.

A second aspect of the invention is a method of fabricating the flash memory cell described above. The method comprises the steps of: forming the floating gate structure over a substrate; forming a source coupling enhancement structure on an exposed portion of the floating gate structure; and forming the source region in the substrate.

DETAILED DESCRIPTION OF THE INVENTION

The present invention is an embedded split gate flash memory cell and its method of fabrication. The memory cell of the present invention utilizes a combination of features and process techniques which increase the source coupling ratio of the cell, thereby, improving the programming and erasing efficiency of the cell.

Figure 6:
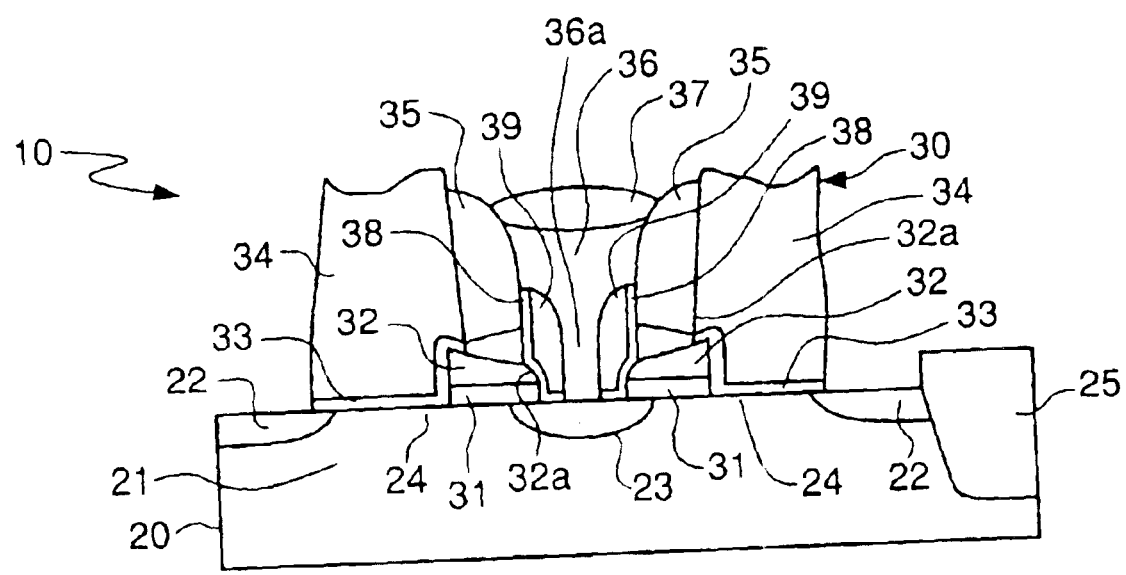
FIG. 6 depicts a flash memory cell according to the present invention.

An embodiment of an embedded flash memory cell 10 in accordance with the present invention is shown in FIG. 6. As can be seen, the memory cell 10 is formed over an active region 21 of a semiconductor substrate 20. The active region 21 of the substrate may be doped with an impurity that provides the active region with an n- or a p-type conductivity. The active region 21 of the substrate 20 may contain two drain regions 22a, 22b and a source region 23 disposed between the drain regions 22. A channel region 24 is defined between each drain region 22 and the source region 23. The source 23 and drain regions 22 may be doped with an impurity that provide the same with a conductivity type opposite to that of the active region 21.

The memory cell 10 has a split gate structure 30 that is self-aligned to a shallow trench isolation (STI) region 25 and source regions 23. The split gate structure 30 comprises a split floating gate structure and a split control gate structure. The split floating gate structure may comprise two thin, high quality tunnel or floating gate dielectric films 31 disposed over the active region 21 of the semiconductor substrate 20. Each floating gate dielectric film 31 may slightly overlap a respective end portion of the source region 23. A floating gate electroconductive film 32 may be disposed over each floating gate dielectric film 31.

The control gate structure may comprise two thin control gate dielectric films 33 disposed over the active region 21 of the semiconductor substrate 20, adjacent to their associated floating gate dielectric films 31. One end of each control gate dielectric film 33 may slightly overlap an end portion of a respective one of the drain regions 22. The other end of each control gate dielectric film 33 may extend up and slightly over an associated one of the floating gate electroconductive films 32. The control gate films 33 are operative as an intergate dielectric. A control gate film 34 may be disposed over each of the control gate dielectric films 33 such that it partially overlaps its associated floating gate electroconductive film 32.

An intergate dielectric film 35 may be disposed partially over the portion of each floating gate electroconductive film 32 not overlaped by the control gate structure. A source contact element 36 allows appropriate voltages Vss to be applied to the source region 23 for writing and erasing the cell 10. The source contact 36 is capped with a dielectric film 37.

The source coupling ratio of the cell 10 is increased in the present invention by providing a source coupling enhancement structure between the tapered portion 36a of the source contact 36 and each floating gate structure 32. In one embodiment of the present invention, the source coupling enhancement structure may comprise a thin, capacitive dielectric film 38 and an electroconductive spacer 39. The thin, capacitive dielectric film 38 preferably comprise an oxide-nitride-oxide (ONO) composite film because such a film can effectively avoid charge loss (electric or hole) of the floating gate. The capacitive dielectric film 38 may also comprise, without limitation, a silicon oxide film or a nitride film. The electroconductive spacers 39 may comprise polysilicon. The source coupling enhancement structure covers edge portions 32a of the floating gate conductive film 32 not covered by the intergate dielectric spacers 35 (FIG. 4C). The source coupling enhancement structures 38, 39 extend to and cover a portion of the source region 23.

The large cover area provided by the source coupling enhancement structures, between the split floating gate 32 and the source region 23, increases the capacitance therebetween. The increased capacitance provided between the source region 23 and the floating gate 32 increases the source coupling ratio of the cell 10. The increased source coupling ratio, in turn, increases the programming and erasing efficiency of the cell 10 because:

$$SCR=Csf/(Csf+Cgf+Cdf+Cbf),$$

$$GCR=Cgf/(Csf+Cgf+Cdf+Cbf),$$

$$DCR=Cdf/(Csf+Cgf+Cdf+Cbf),$$

$$BCR=Cbf/(Csf+Cgf+Cdf+Cbf),$$

wherein SCR, GCR, DCR, and BCR respectively represent the source, gate, drain, and substrate coupling ratios and Csf is the capacitance between the source and floating gate, Cgf is the capacitance between the gate and the floating gate, Cdf is the capacitance between the drain and the floating gate, and Cbf is the capacitance between the substrate and floating gate;

$$Vfg=Vs \times SCR+Vg \times GCR+Vd \times DCR+Vb \times BCR,$$

wherein Vfg is the voltage coupled to the floating gate, and Vs, Vg, Vd, and Vb represent the voltages respectively applied to the source, gate, drain, and substrate;

For a split gate cell, BCR is approximately equal to 0, thus, the voltage coupled to the substrate (VB) is equal to 0. Accordingly, $$Vfg=Vs \times SCR+Vg \times GCR+Vd \times DCR, \text{ and}$$

$$SCR+GCR+DCR=1$$

Erasing status:

$$Vs=Vd=0, \text{ and}$$

$$Vfg=Vg \times GCR.$$

Programming status:

$$Vfg=Vs \times SCR+Vg \times GCR+Vd \times DCR$$

In erasing, the efficiency of the cell will be improved if Vfg is lower, and in programming, the efficiency of the cell will be improved if Vfg is higher. Hence, increasing the SCR of the cell in accordance with the present invention improves the cell's program and erase efficiency at the same time.

The flash memory cell 10 of FIG. 6 can be fabricated by the following method described in conjunction with FIGS. 1A–1C, 2A–2C, 3A–3D, 4A–4C, and 5A–5F.

Figure 1A:
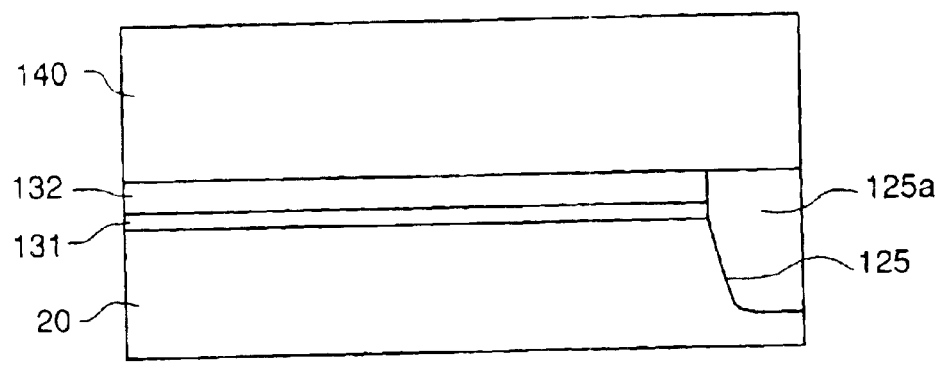
FIGS. 1A–1C, 2A–2C, 3A–3D, 4A–4C, and 5A–5F are sectional views depicting a method for fabricating a flash memory cell 10 according to the present invention.

FIG. 1A depicts the semiconductor substrate 20 used in the fabrication of the flash memory cell 10 of the present invention. The semiconductor substrate 20 is not limited to a particular type and may be those generally used in a semiconductor memory device, examples thereof including an element semiconductor, such as silicon and germanium, and a compound semiconductor, such as GaAs, InGaAs and ZnSe. Among these, silicon is preferred.

A dielectric film 131 suitable for use as a tunnel oxide film, is formed over the active region 21 (p-type in the case of the embodiment shown in FIG. 6) of the substrate 20 followed by a first electroconductive film 132 that will form the floating gates 32 of the split gate structure 30.

The dielectric film 131 can be a silicon oxide film having a thickness between about 60 to 120 angstroms. Such films can be conventionally formed using, for example but not limitation, a thermal oxidation, a chemical vapor deposition (CVD) or low pressure chemical vapor deposition (LPCVD).

The first electroconductive film 132 can be a polysilicon which is formed over the dielectric film 131 through conventional methods including without limitation CVD and physical vapor deposition (PVD) utilizing sputtering methods employing suitable silicon source materials. The thickness of the first electroconductive film 132 can typically range between about 300 to 1500 angstroms.

A first photoresist mask (not shown) is formed over the substrate 20 using conventional methods to mask the first electroconductive film 132. The unmasked portions of the substrate 20, i.e., the first electroconductive film 132, and the underlying areas of the dielectric film 131 and substrate 20, are sequentially etched to form a shallow trench 125 in the substrate 20. Etching can be accomplished using a conventional etching method including without limitation reactive ion etching (RIE). The shallow trench 125 can have a depth between about 2000 to 6000 angstroms. The trench 125 is then filled with a suitable dielectric isolation material 125a, such as silicon oxide, using a conventional method including but not limited to LPCVD. The oxide 125a filled trench 125 forms the shallow trench isolation (STI) region 25 shown in FIG. 6. The first photoresist mask is then removed using conventional methods.

Still referring to FIG. 1A, a floating gate implant is performed by doping the first electroconductive layer 132 with As or P ions at a dosage level between about 1E14 atoms/cm$^2$ and 1E16 atoms/cm$^2$ and energy level between about 1 KeV to 1 KeV. A memory well implant is used for a word line Vt implant and anti-punch through implant to be performed further on. After doping the first electroconductive 132, an oxidation mask 140 is formed over the first electroconductive film 132 to prevent oxidation thereof during further processing. The oxidation mask 140 can be silicon nitride. The oxidation mask 140 can be conventionally formed using, for example but not limitation, a LPCVD process. The oxidation mask 140 is typically formed to a thickness between about 2000 angstroms to 6000 angstroms.

Figure 1B:
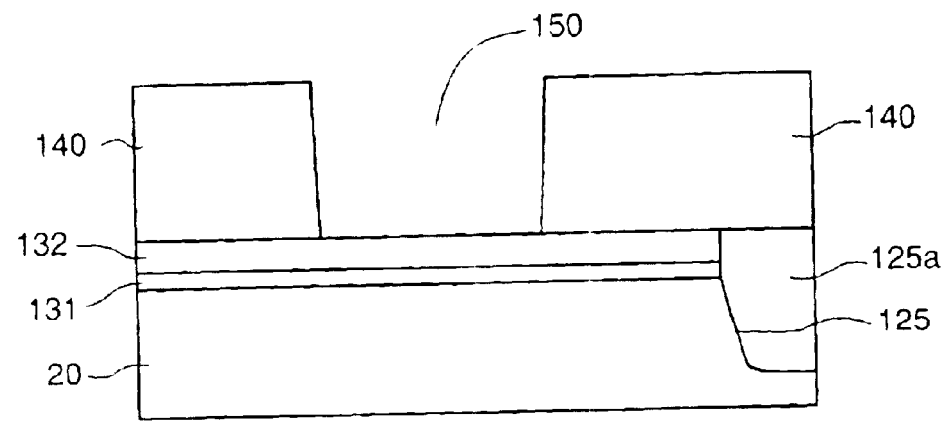

In FIG. 1B, a second photoresist mask (not shown) is formed over the oxidation mask 140. The unmasked portion of the oxidation mask 140 is etched down to the first electroconductive film 132, thereby forming a trench 150. Etching can be accomplished using a conventional etching method including without limitation RIE.

The portion of the first electroconductive film 132 now exposed at the bottom of the trench 150, is doped by implanting AS or P ions at a dosage level between about 1E14 atoms/cm$^2$ and 1E16 atoms/cm$^2$ and energy level between about 1 KeV to 20 KeV. This cell implant serves the purpose of reducing work function and floating gate depletion capacitance near channel surface. The second photoresist mask is then removed using conventional methods.

Figure 1C:
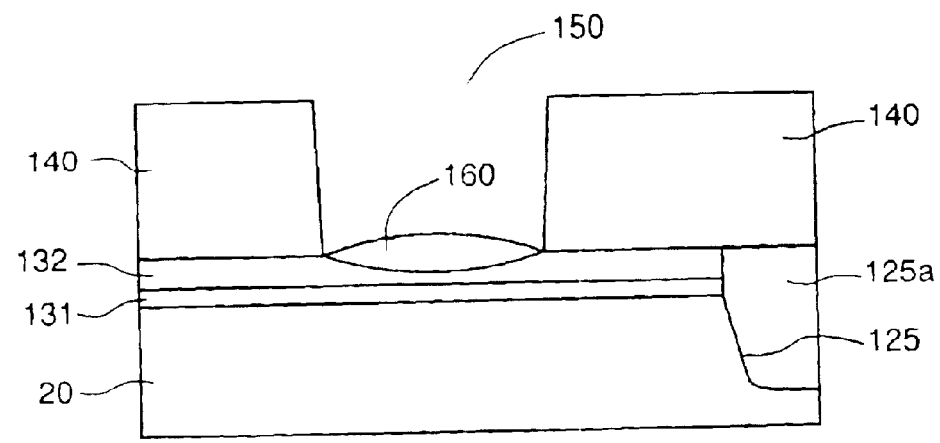

In FIG. 1C, the exposed portion of the first electroconductive film 132 at the bottom of the trench 150 is slope etched using conventional isotropic etching methods including but not limited to chemical dry etching (CDE) or RIE, and then, a poly-oxide cap 160 having a thickness of between about 100 to 500 angstroms is formed using a conventional method such as but not limited to wet oxidization at a temperature between about 800° C. to 1000° C.

Figure 2A:
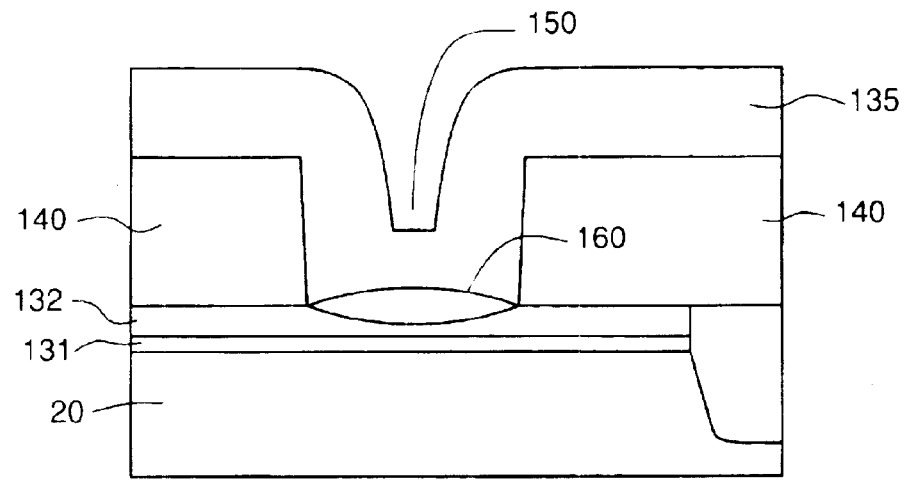

In FIG. 2A, an intergate dielectric film 135 formed by a glass material, such as tetraethylorthosilicate (TEOS), is conformally formed over the substrate 20. The intergate dielectric film 135 may formed using any conventional method including without limitation a plasma enhanced chemical vapor deposition (PECVD). The intergate dielectric film 135 is typically formed to a thickness between about 1500 angstroms to 4000 angstroms.

Figure 2B:
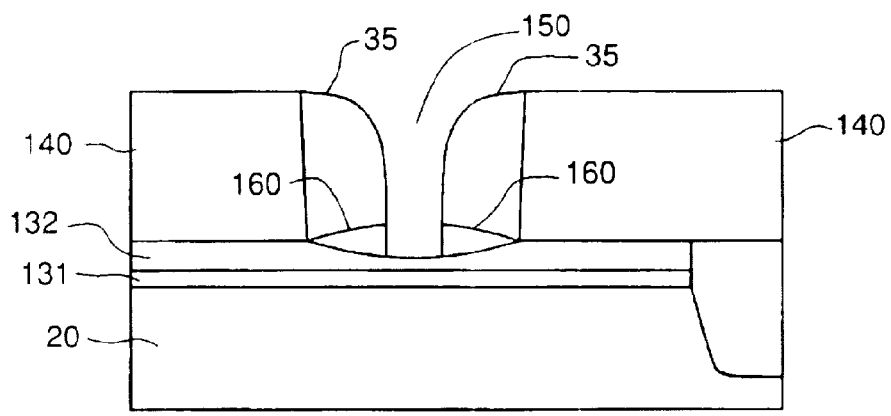

In FIG. 2B, the intergate dielectric film 135 is etched back to partially form the previously described intergate dielectric spacers 35 in the trench opening 150. This can accomplished using a conventional anisotropic etching process such as RIE. This etch back process also etches through a generally intermediate portion of the poly-oxide cap 160, thereby exposing the underlying floating gate electroconductive film.

Figure 2C:
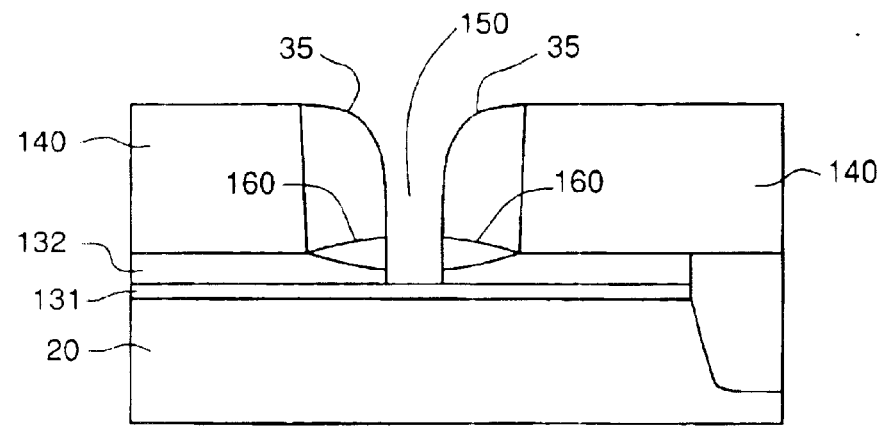

In FIG. 2C, the exposed portion of the floating gate electroconductive film 132 is removed by performing a first floating gate etch process which splits the floating gate electroconductive film 132 into two discrete structures, thereby exposing an underlying portion of the floating gate dielectric film 131. The partially formed intergate dielectric spacers 35 are used within the trench 150 as an etch mask during the first floating gate etch process.

Figure 3A:
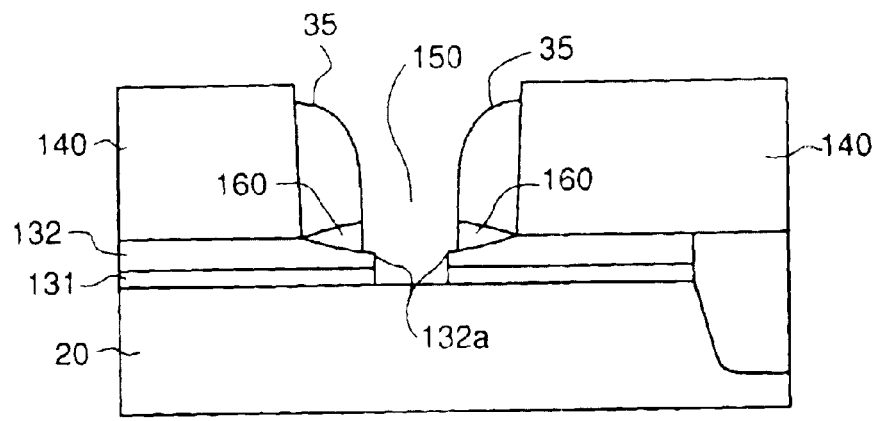

In FIG. 3A, an intergate spacer/floating gate dielectric etch process is performed to further etch the intergate spacers 35 (and polyoxide caps 160) back slightly to expose the underlying edge portions 132a of the split floating gate film 131, and to substantially remove the exposed portion of the floating gate dielectric film 131 at the bottom of the trench 150. This can accomplished using a conventional isotropic etching process. As shown, this etch process extends the depth of the trench 150 to the substrate 20.

Figure 3B:
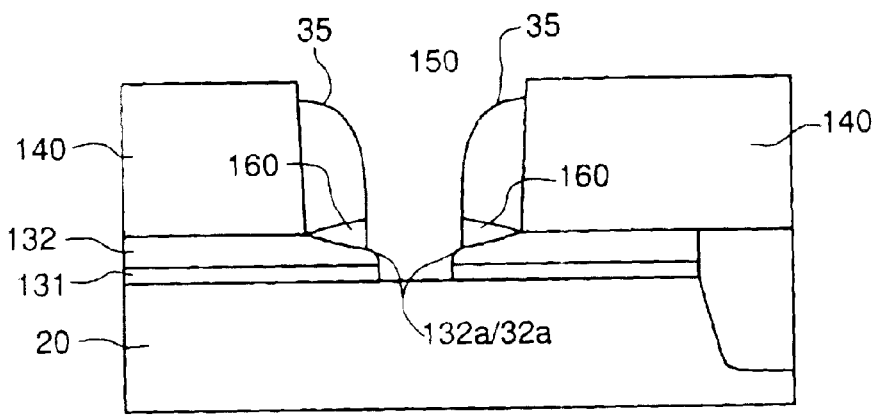

In FIG. 3B, the exposed edge portions 132a of the split floating gate conductive film 132 are rounded by performing an isotropic etch process using an etchant which is selective to the first electroconductive film 132. Rounding the edge portions 132a of the floating gate conductive film 132 prevents the charge (electron or electric hole) of the floating gate from passing through film 138 to be discussed further, or to source contact 36. The intergate dielectric spacers 35 operate as a mask during this etching process.

Figure 3C:
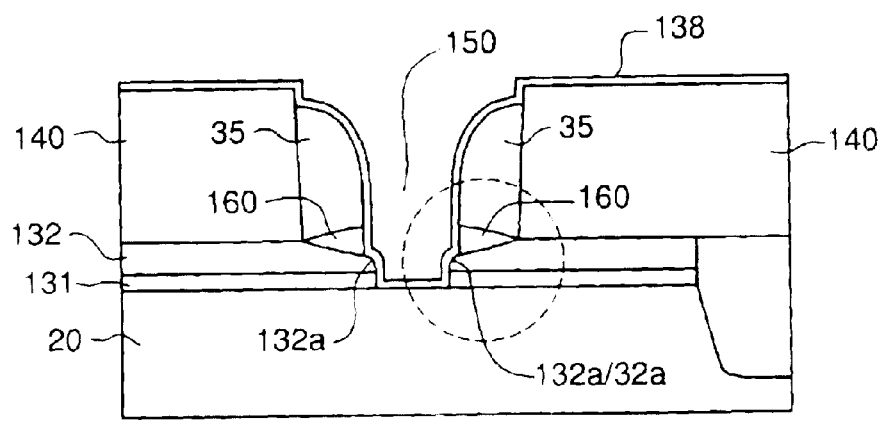
Figure 3D:
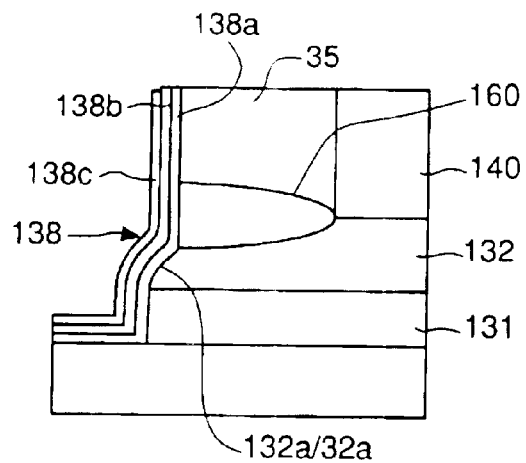

In FIG. 3C, a capacitive, dielectric film 138 is conformally formed over the substrate 20. As described earlier, the capacitive, dielectric film 139 will form element 38 of the source coupling enhancement structure. The capacitive, dielectric film 138, preferably comprises an oxide-nitride-oxide (ONO) composite film. As shown in FIG. 3D, the ONO composite film 138 comprises an inner silicon oxide film 138a, an intermediate silicon nitride ($Si_3N_4$) film 138b, and an outer silicon oxide film 138c. Methods for forming ONO composite films are well known in the art and may include using a high temperature oxide (HTO) process to form the inner 138a and outer 138c oxide portions of the film 138, and LPCVD to form the intermediate nitride portion 138b of the film 138. More specifically, the exposed surfaces of the oxidation mask 140, the intergate dielectric spacers 35 (and oxide caps 160), the edges 132a of the first electroconductive film 132, the dielectric films 131 and the substrate 20 are deposited by HTO to form the inner silicon oxide film 138a, which may have a thickness of about 60 angstroms. The intermediate silicon nitride film 138b may then be formed on the inner silicon oxide film 138a by a LPCVD process. The silicon nitride film 138b may have a thickness of about 70 angstroms. The outer silicon oxide film 138c is formed by HTO on the intermediate silicon nitride film 138b. The outer silicon oxide film 138c may have a thickness of about 80 angstroms. It should be understood, however, that the thickness of each of the films of the ONO composite film 138 may vary depending upon other process parameters.

Figure 4A:
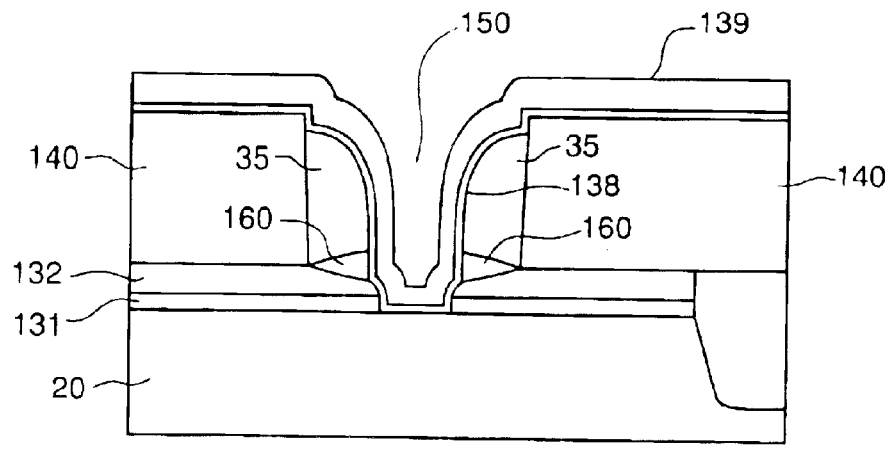

In FIG. 4A, an electroconductive spacer film 139 is formed over the ONO composite film 138 using any conventional method including without limitation, LPCVD, chemical vapor deposition (CVD), or physical vapor deposition PVD sputtering methods employing suitable silicon source materials. The electroconductive film 139, which preferably comprises a polysilicon, will form the spacer elements 39 of the source coupling enhancement structure described earlier. The thickness of the electroconductive spacer film 139 typically ranges between about 200 to 1000 angstroms.

Figure 4B:
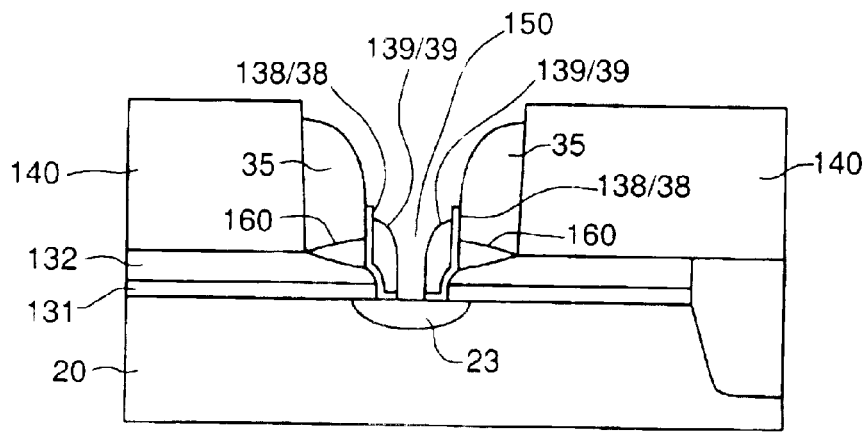
Figure 4C:
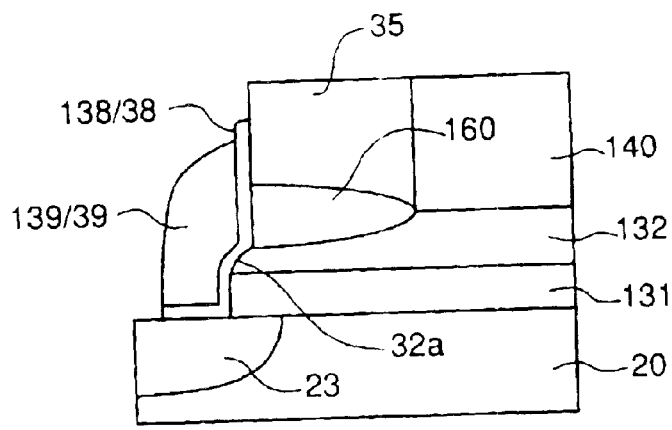

In FIGS. 4B and 4C, the electroconductive spacer film 139 is etched back to form the spacers 39 of the source coupling enhancement structure at the bottom portion of the trench opening. Etching of the electroconductive spacer film can be achieved through the use of a conventional anisotropic etching process. This etching process also finalizes the structure of the capacitive dielectric film 138 (forming films 38 shown in FIG. 6), thereby exposing the underlying the substrate 20 at the bottom of trench 150.

Still referring to FIGS. 4B and 4C, a source implant is performed through the opening defined by the electroconductive spacers 39. The source implant uses As and P ions at a dosage level between about 1E14 atoms/$cm^2$ and 5E15 atoms/$cm^2$ and energy level between about 5 KeV to 60 KeV to form the source region 23. The source region 23 is annealed to affect lateral diffusion and form coupling between the source 23 and split floating gate structures 31, 32.

Figure 5A:
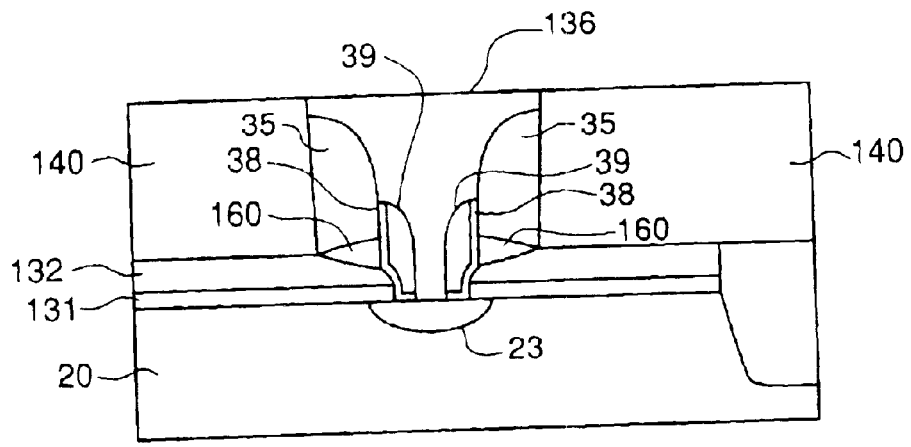
Figure 5B:
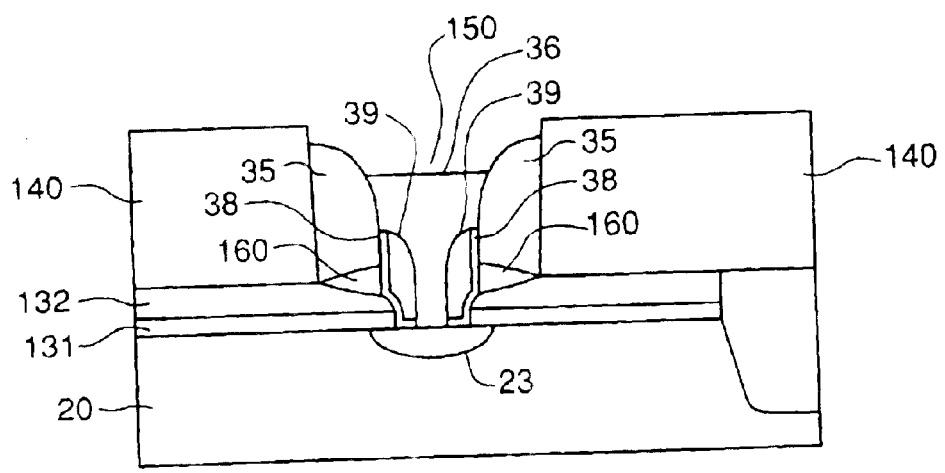

In FIG. 5A, a second electroconductive film 136 is formed over the substrate 20. The second electroconductive film fills the trench 150. The second electroconductive film 136 can be a polysilicon which is formed through conventional methods including without limitation LPCVD, CVD or PVD sputtering methods employing suitable silicon source materials. The substrate 20 is then planarized to remove the second electroconductive film 136 from the surface of the oxidation mask 140. Planarization of the substrate 20 can be achieved using a chemical mechanical polishing (CMP) process.

In FIG. 5A, the second electroconductive film 136 disposed in the trench 150 is etched backed to form the source contact 36. Etching can be accomplished using a dry etch process which is very selective to the second electroconductive film 136.

Figure 5C:
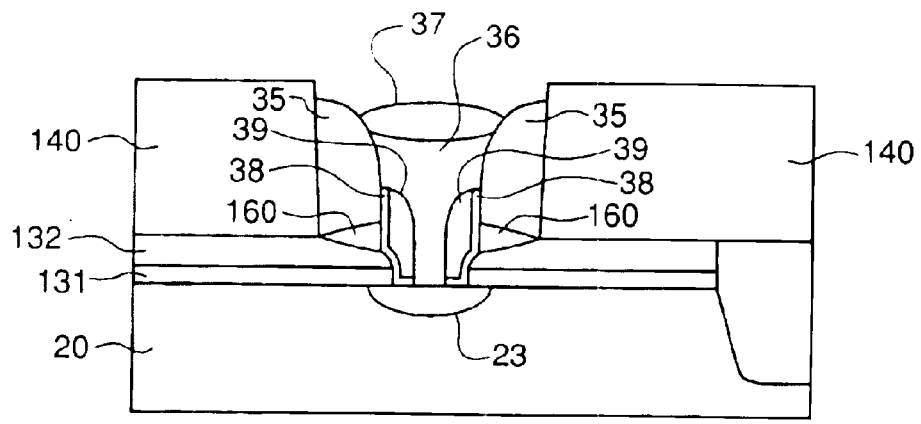

In FIG. 5C, the dielectric film 37 is formed over the source contact 36. The dielectric film 37 can be a silicon oxide formed using thermal oxidation.

Figure 5D:
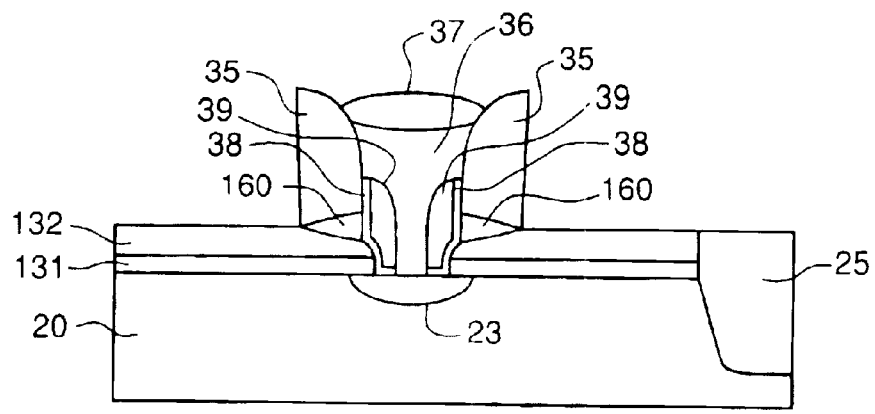

In FIG. 5D, the oxidation mask 140 (FIG. 5C) is removed using a conventional method to expose the underlying portions of the first electroconductive film 132 that forms the split floating gate 32.

Figure 5E:
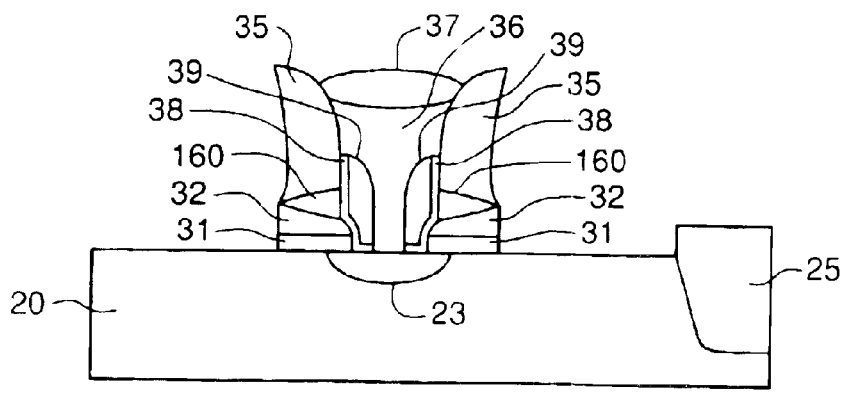

In FIG. 5E, the exposed portions of the first electroconductive film 132 and the underlying portions of the dielectric film 131 of the split floating gate structure 32, 31 are removed in a second floating gate etch process. The second floating gate etch process is typically performed using an anisotropic etch process, such as RIE to minimize undercutting of the first electroconductive film 132 under the intergate dielectric spacers 35.

Figure 5F:
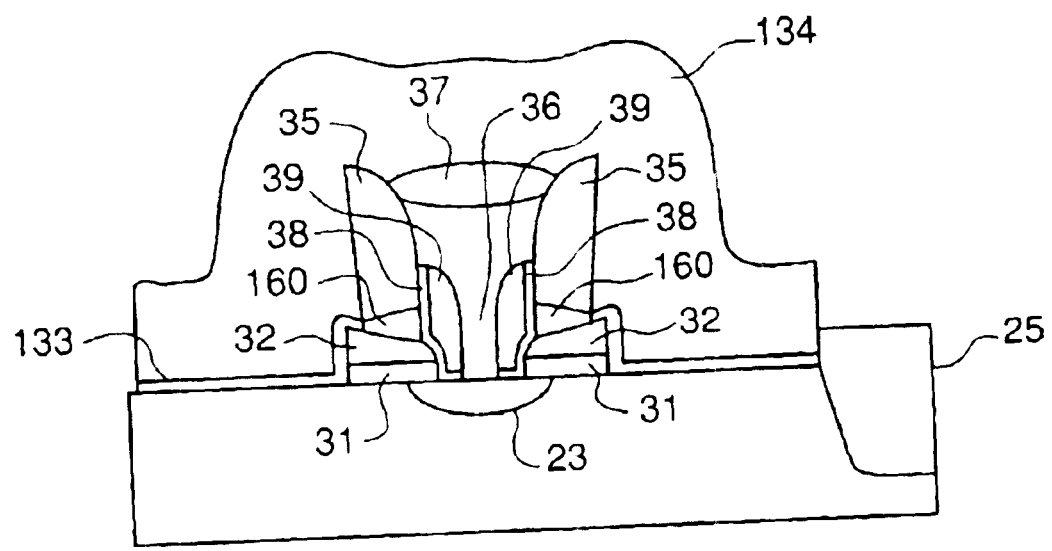

In FIG. 5F, a second dielectric film 133 is conformally formed over the substrate 20. The second dielectric film 133 can be a high-temperature oxide (HTO) formed using a LPCVD. The second dielectric film 133 may have a thickness between about 100 angstroms to 300 angstroms. A third electroconductive film 134 is conformally formed over the substrate 20. The third electroconductive film 134 may have a thickness between about 300 angstroms to 2000 angstroms and be formed by LPCVD, CVD or PVD sputtering methods employing suitable silicon source materials.

The third electroconductive film 134 is etched to form the control gate electroconductive spacers 34 shown in FIG. 6 which will serve as a control gate. The control gate electroconductive spacers 34 may be implanted with B ions at a dosage level between about 1E14 atoms/cm$^2$ and 5E15 atoms/cm$^2$ and energy level between about 40 KeV to 150 KeV in a halo implant process. The cell 10 is completed by performing a drain implant using P ions at a dosage level between about 1E14 atoms/cm$^2$ and 9E15 atoms/cm$^2$, and energy level between about 10 to 100 KeV to form the drains 22 shown in FIG. 6.

While the foregoing invention has been described with reference to the above embodiments, various modifications and changes can be made without departing from the spirit of the invention. Accordingly, all such modifications and changes are considered to be within the scope of the appended claims.

What is claimed is:

1. A flash memory cell comprising:
   a substrate having a source region;
   a floating gate structure disposed over the substrate and associated with the source region;
   a source coupling enhancement structure covering an exposed portion of the floating gate structure and extending to the source region.

2. The flash memory according to claim 1, further comprising a control gate structure at least partially disposed over the floating gate structure, the control gate structure associated with a drain region of the substrate.

3. The flash memory cell according to claim 1, wherein the source coupling enhancement structure includes a capacitive dielectric film.

4. The flash memory cell according to claim 3, wherein the capacitive dielectric film comprises an oxide-nitride-oxide composite film.

5. The flash memory cell according to claim 3, wherein the source coupling enhancement structure further includes an electroconductive spacer.

6. The flash memory cell according to claim 2, wherein the floating gate and control gate structures comprise a split gate structure.

7. The flash memory cell according to claim 2, further comprising an intergate dielectric disposed between the floating and control gate structures.

8. The flash memory cell according to claim 1, wherein the substrate further includes an active region and an isolation region, the source region being disposed in the active region.

9. The flash memory cell according to claim 1, wherein the floating gate structure includes a dielectric film and an electroconductive film disposed over the dielectric film.

10. The flash memory cell according to claim 9, wherein the dielectric film comprises a silicon oxide film and the electroconductive film comprises a polysilicon film.

11. The flash memory cell according to claim 2, wherein the control gate structure includes a dielectric film and an electroconductive spacer.

12. The flash memory cell according to claim 11, wherein the dielectric film comprises a high temperature oxide film and the electroconductive spacer comprises a polysilicon spacer.

13. The flash memory cell according to claim 2, further comprising a channel region disposed between the source and drain regions.

14. The flash memory cell according to claim 1, further comprising a contact for applying voltages to the source region.

15. A method of fabricating a flash memory cell, the method comprising the steps of:
    forming a floating gate structure over a substrate;
    forming a source coupling enhancement structure on an exposed portion of the floating gate structure;
    forming a source region in the substrate, the source region being associated with the floating gate structure and the source coupling enhancement structure extending to the source region.

16. The method according to claim 15, further comprising the step of forming a control gate structure at least partially over the floating gate structure.

17. The method according to claim 16, further comprising the step of forming a drain region in the substrate, the control gate structure being associated with the drain region.

18. The method according to claim 15, wherein the step of forming the source coupling enhancement structure includes the step of forming a capacitive dielectric film over an exposed portion of the floating gate structure.

19. The method according to claim 18, wherein the capacitive dielectric film comprises an oxide-nitride-oxide composite film.

20. The method according to claim 18, wherein the step of forming the source coupling enhancement structure includes the step of forming an electroconductive spacer over the capacitive dielectric film.

21. The method according to claim 15, wherein the step of forming the source coupling enhancement structure includes the step of forming an electroconductive spacer over an exposed portion of the floating gate structure.

22. The method according to claim 16, wherein the floating gate and control gate structures comprise a split gate structure.

23. The method according to claim 16, wherein the step of forming the source coupling enhancement structure includes the step of forming an intergate dielectric between the floating and control gate structures.

24. The method according to claim 15, further comprising the step of forming an isolation region adjacent an active region in the substrate, the source region being disposed in the active region.

25. The method according to claim 15, wherein the step of forming the floating gate structure includes the steps of:
    forming a dielectric film over the substrate; and
    forming an electroconductive film over the dielectric film.

26. The method according to claim 25, wherein the dielectric film comprises a silicon oxide film and the electroconductive film comprises a polysilicon film.

27. The method according to claim 16, wherein the step of forming the control gate structure includes the steps of:
    forming a dielectric film over the substrate; and
    forming an electroconductive spacer over the dielectric film.

28. The method according to claim 27, wherein the dielectric film comprises a high temperature oxide film and the electroconductive spacer comprises a polysilicon spacer.

29. The method according to claim 16, wherein a channel region is disposed between the source and drain regions.

30. The method according to claim 15, further comprising the step of forming a contact for applying voltages to the source region.

* * * * *